(12) United States Patent
Gaku et al.

(10) Patent No.: US 6,736,988 B1
(45) Date of Patent: May 18, 2004

(54) COPPER-CLAD BOARD SUITABLE FOR MAKING HOLE WITH CARBON DIOXIDE LASER, METHOD OF MAKING HOLE IN SAID COPPER-CLAD BOARD AND PRINTED WIRING BOARD COMPRISING SAID COPPER-CLAD BOARD

(75) Inventors: Morio Gaku, Tokyo (JP); Nobuyuki Ikeguchi, Tokyo (JP); Yoshihiro Kato, Tokyo (JP); Taro Yoshida, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 189 days.

(21) Appl. No.: 09/699,419

(22) Filed: Oct. 31, 2000

(30) Foreign Application Priority Data

| Nov. 4, 1999 | (JP) | 11-314105 |
| Nov. 4, 1999 | (JP) | 11-314106 |
| Mar. 17, 2000 | (JP) | 2000-075430 |
| Mar. 17, 2000 | (JP) | 2000-075431 |
| Jun. 6, 2000 | (JP) | 2000-169031 |
| Jun. 6, 2000 | (JP) | 2000-169032 |

(51) Int. Cl.$^7$ .......... H01B 13/00; H05K 3/00; B44C 1/22
(52) U.S. Cl. .......... 216/65; 216/13; 216/17; 216/219; 216/121.6; 216/121.68
(58) Field of Search .......... 216/13, 17, 65; 219/121.6, 121.68

(56) References Cited

U.S. PATENT DOCUMENTS 5,073,687 A * 12/1991 Inagawa et al. ......... 219/121.7
5,257,140 A * 10/1993 Rogers ......... 359/884
5,888,627 A * 3/1999 Nakatani ......... 428/209
6,280,641 B1 * 8/2001 Gaku et al. ......... 216/17

FOREIGN PATENT DOCUMENTS

| EP | 0 396 056 | 11/1990 | |
| EP | 0 943 392 | 9/1999 | |
| JP | 4-71292 A | * 3/1992 | H05K/3/38 |
| JP | 411087931 A | * 3/1999 | H05K/3/00 |
| JP | 200126393 A | * 11/2001 | H05K/1/09 |
| WO | 98/20533 | 5/1998 | |

* cited by examiner

*Primary Examiner*—Nadine G. Norton
*Assistant Examiner*—Shamim Ahmed
(74) *Attorney, Agent, or Firm*—Wenderoth, Lind & Ponack, LLP

(57) ABSTRACT

A copper-clad board suitable for making a hole with a carbon dioxide gas laser, which copper-clad board is obtained by disposing a double-side-treated copper foil provided with a metallic-treatment layer having a high absorption rate of a carbon dioxide gas laser energy on at least one surface, at least on an outer layer of a thermosetting resin composition layer such that the metallic-treatment layer is formed on a shiny surface of the copper foil which shiny surface is to be a surface layer, and laminate-forming the double-side-treated copper foil and the thermosetting resin composition layer under heat and pressure, to make an alloy of the metallic-treatment layer and the copper by the above heating, a method of making hole in the above copper-clad board and a printed wiring board comprising the above copper-clad board.

5 Claims, 6 Drawing Sheets

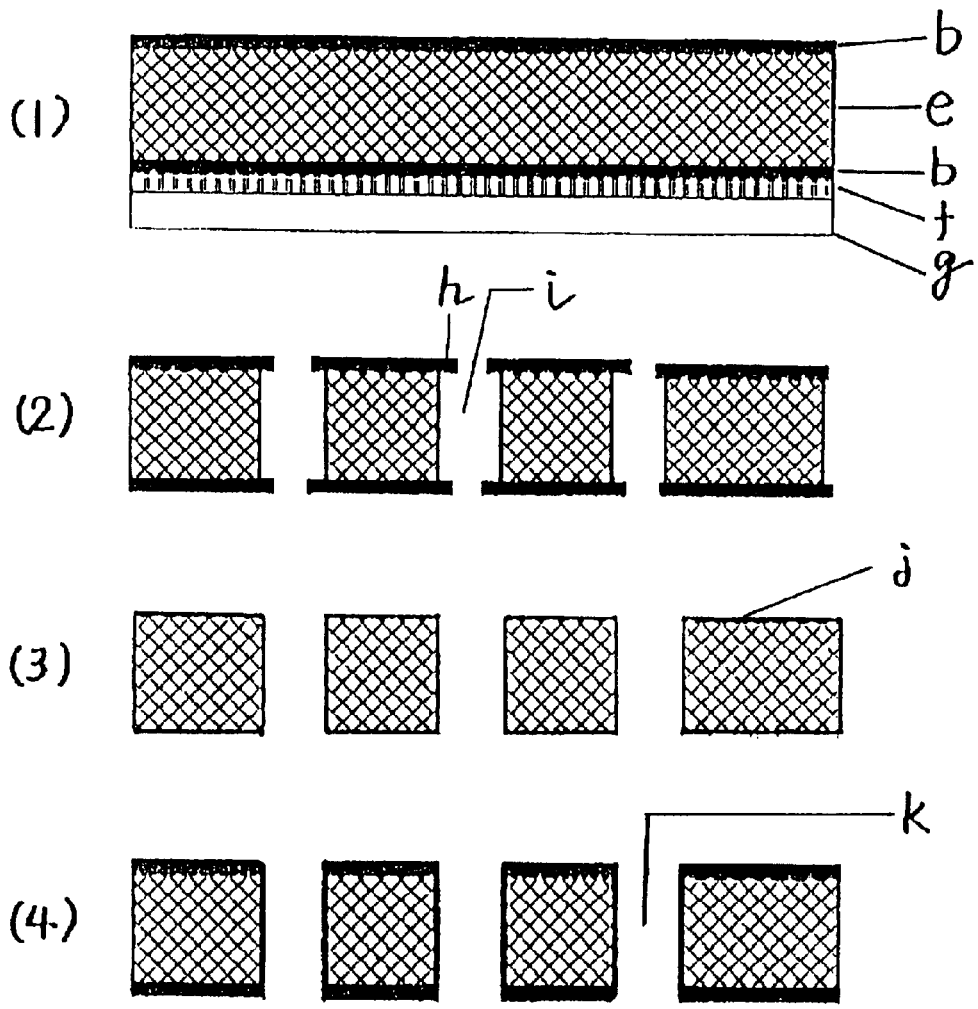

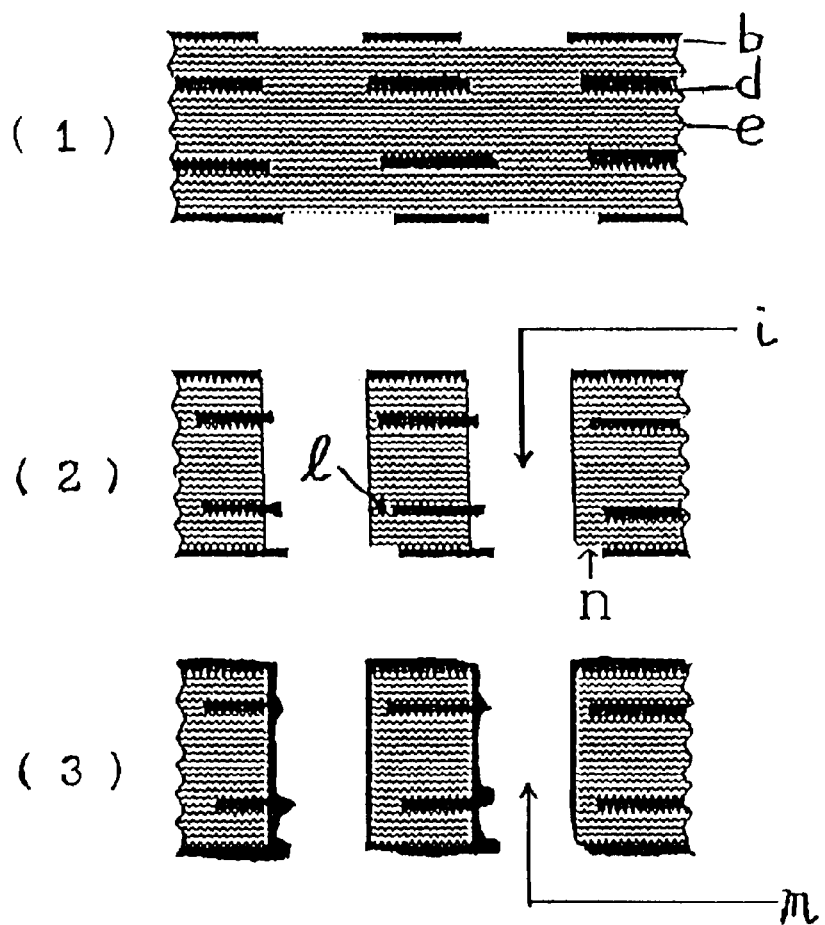

COPPER-CLAD BOARD SUITABLE FOR MAKING HOLE WITH CARBON DIOXIDE LASER, METHOD OF MAKING HOLE IN SAID COPPER-CLAD BOARD AND PRINTED WIRING BOARD COMPRISING SAID COPPER-CLAD BOARD

FIELD OF THE INVENTION

The present invention relates to a copper-clad board suitable for making a hole with a carbon dioxide gas laser, which copper-clad board is obtained by disposing a double-side-treated copper foil provided with a metallic-treatment layer having a high absorption rate of a carbon dioxide gas laser energy on at least one surface thereof, on at least an outer layer of a thermosetting resin composition layer such that the metallic-treatment layer is formed on a shiny surface of the copper foil which shiny surface is to be used as a surface layer, and laminate-forming the double-side-treated copper foil and the thermosetting resin composition layer under heat and pressure, a method of making a hole in said copper-clad board with a carbon dioxide gas laser, and a printed wiring board prepared from said copper-clad board. More specifically, the above metallic-treatment layer is a layer which can form an alloy with copper by the heating and the pressurization at the time of preparing the copper-clad board. The above copper alloy layer has properties that a penetration hole and/or a blind via hole having a small diameter can be made for absorbing a carbon dioxide gas laser when a copper foil surface is directly irradiated with a carbon dioxide gas laser. A high-density printed wiring board prepared by providing the above copper-clad board and making a hole having a small diameter in the copper-clad board with a carbon dioxide gas laser is suitably used for a small-sized and light weight semiconductor plastic package, a motherboard and the like.

PRIOR ARTS OF THE INVENTION

Conventionally, a copper-clad board having a surface copper foil provided with a metallic surface-treatment which is capable of making a penetration hole and/or a blind via hole having a fine form by direct irradiation with a carbon dioxide gas laser, is not used for a high-density printed wiring board used for a semiconductor plastic package or the like. Further, attempts to make a hole by directly irradiating a copper foil surface with a carbon dioxide gas laser have been made. However, no hole is made with an energy of about 40 mJ since its bean is reflected. In this regard, there have been made attempts to use a double-side roughened copper foil having surface roughness of 3 to 5 mm. However, it is difficult to form a fine pattern, and no high-density printed wiring board can be produced.

Conventionally, drilling with a mechanical drill makes the penetration hole. In recent years, the diameter of the penetration hole becomes increasingly small, and designing is made such that the diameter of a hole is 0.15 mm or less. However, when a hole having such a small diameter is made, the problem is that the drill bents or breaks during the formation of a hole or that the processing speed is low, due to the small diameter of the drill, which results in problems in productivity and workability.

The blind via hole is made by etching and removing a copper foil in a position where a hole is to be made and then irradiating the position with a low-energy carbon dioxide gas laser. The above process includes steps of laminate-bonding of an etching film, exposure, development, etching, and peeling of the film. Therefore, much time is required so that a problem occurs in workability. Further, there is also proposed a method wherein a copper foil surface is oxidized to form a black copper oxide layer and the resultant surface is irradiated with a carbon dioxide gas laser, to make a blind via hole. In this case, the black copper oxide layer of the copper foil surface is easily peeled off by friction or the like and the problem is that no hole is made when the portion where the black copper oxide layer is peeled off is irradiated with the laser. Consequently, the above method is apt to bring about defective items.

There is also proposed a method in which holes having the same size are made in copper foils on front and reverse surfaces through negative films according to a predetermined method, further, a copper foil having similar holes made by etching is disposed as an internal layer copper foil and a hole reaching the front and reverse surfaces is made with a carbon dioxide gas laser. In this case, the problems are that the deviation of the position of the internal copper foil occurs and that spaces occur between lands on the upper and lower surfaces and the hole so that a failure in connection occurs and it is impossible to form lands on the front and reverse surfaces.

Further, in a printed wiring board which is increasingly highly-densified in recent years, the problems are heat-resistance, anti-migration properties, electric insulation after moisture absorption and the like.

SUMMARY OF THE INVENTION

It is an object of the present invention to provide a copper-clad board suitable for making a hole with a carbon dioxide gas laser, in which a penetration hole and/or a blind via hole can be made by directly irradiating a surface copper foil of the copper-clad board with a carbon dioxide gas laser, a method of making a hole in the above copper-clad board and a high-density printed wiring board containing the above copper-clad board.

It is another abject of the present invention to provide a copper-clad board excellent in workability for making a hole and free from the occurrence of defective items with regard to a hole owing to the formation of a metallic-treatment layer which has a high absorption rate of a carbon dioxide gas laser energy and which causes no peelings by friction on a surface copper foil of the copper-clad board, a method of making a hole in the above copper-clad board and a high-density printed wiring board containing the above copper-clad board.

It is further another object of the present invention to provide a high-density printed wiring board free from the occurrence of a short circuit and a breakage in a fine pattern by providing a copper-clad board which is free from a flaw, a dent and an attached resin on its surface copper foil.

It is still further another object of the present invention to provide a high-density printed wiring board excellent in heat-resistance, anti-migration properties and electric insulation after moisture absorption, a copper-clad board which is capable of providing the above high-density printed wiring board, and a method of making a hole in the above copper-clad board.

It is yet another object of the present invention to provide a method of making a hole, which method is suitable for making a hole having a small diameter in a copper-clad board and is used for preparing a printed wiring board excellent in the reliability of the hole having a small diameter with regard to connection.

According to the present invention, there is provided a copper-clad board suitable for making a hole with a carbon dioxide gas laser, which copper-clad board is obtained by disposing a double-side-treated copper foil provided with a metallic-treatment layer having a high absorption rate of a carbon dioxide gas laser energy on at least one surface, on at least an outer layer of a thermosetting resin composition layer such that the metallic-treatment layer is formed on a shiny surface of the copper foil which shiny surface is to be used as a surface layer, and laminate-forming the double-side-treated copper foil and the thermosetting resin composition layer under heat and pressure, to make an alloy of the metallic-treatment layer and the copper by the above heating.

According to the present invention, there is provided a copper-clad board suitable for making a hole with a carbon dioxide gas laser according to the above, wherein the metallic-treatment layer is a layer which contains nickel or nickel and cobalt as essential components.

According to the present invention, there is provided a copper-clad board suitable for making a hole with a carbon dioxide gas laser according to the above, wherein the thermosetting resin composition is a resin composition containing a polyfunctional cyanate ester monomer and/or a prepolymer of said cyanate ester as essential components.

According to the present invention, there is provided a copper-clad board suitable for making a hole with a carbon dioxide gas laser according to the above, wherein the double-side-treated copper foil is a product formed by attaching a B-staged resin layer to a surface opposite to the surface having the metallic-treatment layer.

According to the present invention, there is provided a copper-clad board suitable for making a hole with a carbon dioxide gas laser according to the above, wherein the double-side-treated copper foil is a product formed by attaching a resin sheet to a surface opposite to the surface having the metallic-treatment layer.

According to the present invention, there is provided a copper-clad board suitable for making a hole with a carbon dioxide gas laser according to the above, which copper-clad board is a copper-clad board obtained by disposing a protective sheet to one surface of the double-side-treated copper foil, at least partially bonding the protective sheet to the double-side-treated copper-foil and disposing a B-staged-resin-layer-attached resin sheet on the other surface of the double-side-treated copper foil.

According to the present invention, there is provided a copper-clad board suitable for making a hole with a carbon dioxide gas laser according to the above, which copper-clad board is a copper-clad board obtained by the use of metal-foil-carrier-attached copper foil(s) in which metal foil(s) is/are disposed to one surface or both the surfaces of the double-side-treated copper foil and the metal foil(s) is/are at least partially bonded to the double-side-treated copper foil.

According to the present invention, there is provided a method of making a hole in a copper-clad board, in which the metallic-treatment layer surface of the above copper-clad board is directly irradiated with an energy sufficient for processing a copper foil by means of the pulse oscillation of a carbon dioxide gas laser, to make a penetration hole and/or a blind via hole.

According to the present invention, there is also provided a printed wiring board obtained by making a penetration hole and/or a blind via hole in the above copper-clad board.

BRIEF DESCRIPTION OF DRAWINGS

FIG. 5 shows steps of (2) making a penetration hole for a through hole in a laminate-formed copper-clad board with a carbon dioxide gas laser, (3) removing burrs and etching surface copper foils by SUEP, and (4) carrying out a copper plating in Example 9.

FIG. 6 shows steps of making a hole in a double-side copper-clad multi-layered board with a carbon dioxide gas laser and carrying out a copper plating in Comparative Example 4.

DETAILED DESCRIPTION OF THE INVENTION

Figure 1:
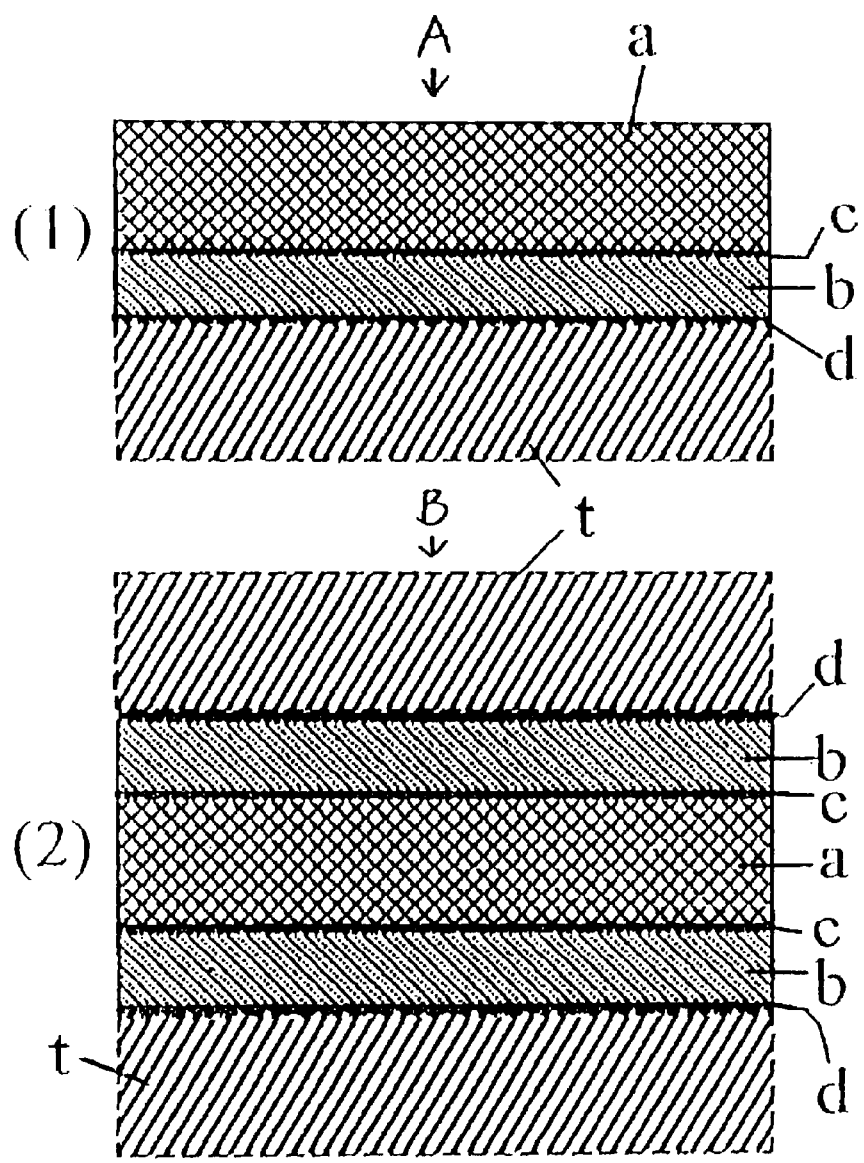
FIG. 1 is an illustration of Example 7, in which B-staged resin sheet(s) having a double-side-treated copper foil attached is attached to one surface (1) or both the surfaces (2) of a protective metal foil.
Figure 2:
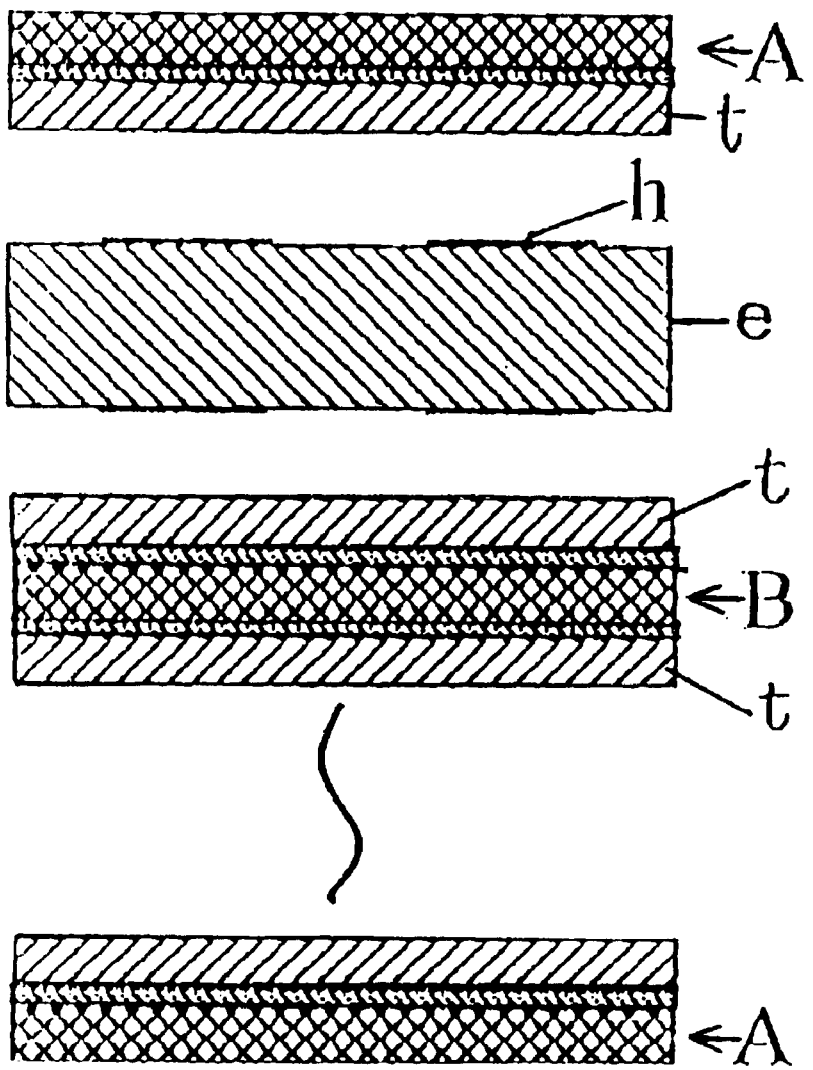
FIG. 2 is an illustration of Example 7, in which a plurality of internal boards are disposed between B-staged resin sheets having a protective-metal-foil-attached treated copper foil attached.
Figure 3:
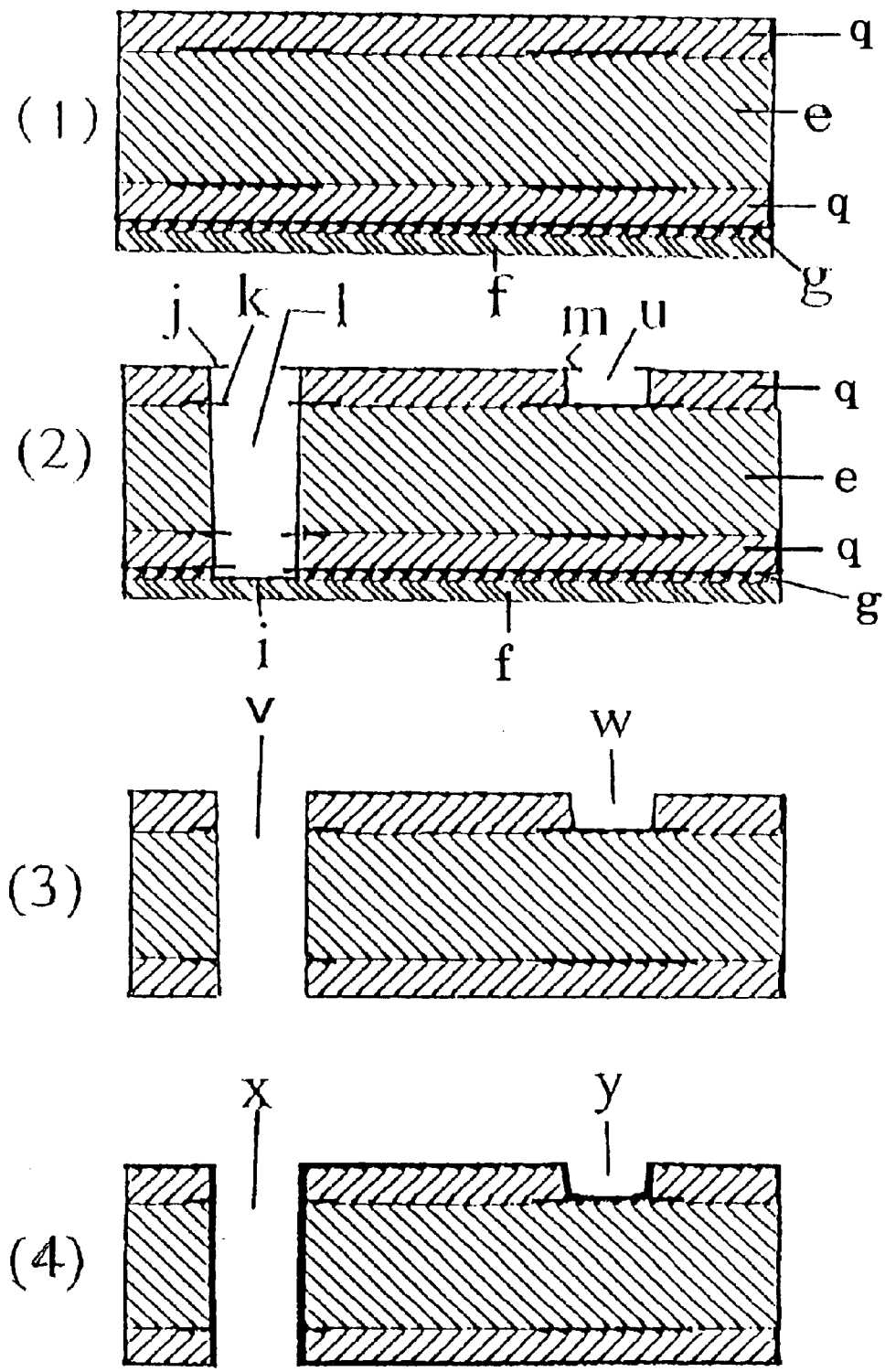
FIG. 3 shows steps of (1) disposing a backup sheet on the lower surface of a laminate-formed copper-clad multi-layered board, (2) making a penetration hole and a blind via hole with a carbon dioxide gas laser, (3) removing burrs and etching surface copper foils by SUEP, and (4) carrying out a copper plating in Example 8.

In the present invention, symbols in FIG. 1 to FIG. 3 attached to the present specification have the following meanings.

A: a sheet in which part of a copper foil of a B-staged resin sheet having a double-side-treated copper foil attached is attached to one surface of a protective metal foil, B: a sheet in which parts of copper foils of B-staged resin sheets having a double-side-treated copper foil attached are attached to both the surfaces of a protective metal foil, a: a protective metal foil, b: copper foil c: a copper foil surface-treatment in which a hole can be made with a carbon dioxide gas laser, d: a general surface-treatment of a copper foil, e: a glass-fabric-substrate copper-clad laminate as an internal board, f: an aluminum foil for a backup sheet, g: a polyvinyl alcohol resin layer, h: copper foil circuits of an internal board, i: a portion where a laser beam is stopped with an aluminum foil when a penetration hole is made with a carbon dioxide gas laser, j: outer layer copper foil burrs occurring in a penetration hole portion, k: internal layer copper foil burrs occurring in a penetration hole portion, l: a portion where a penetration hole is made with a carbon dioxide gas laser, m: outer layer copper foil burrs occurring in a blind via hole portion, n: a surface layer portion where a copper foil is removed by etching for making a penetration hole, o: an internal layer portion where a copper foil is removed by etching for making a penetration hole, p: a portion where a penetration hole is made with a low-energy carbon dioxide gas laser, q: film-attached double-side-treated copper foil B-staged resin sheet, t: a B-staged resin layer attached to a copper foil surface, u: a portion where a blind via hole is made with a carbon dioxide gas laser, v: a penetration hole portion treated by SUEP, w: a blind via hole portion treated by SUEP, x: a penetration hole portion plated with copper, and y: a blind via hole portion plated with copper.

Figure 4:
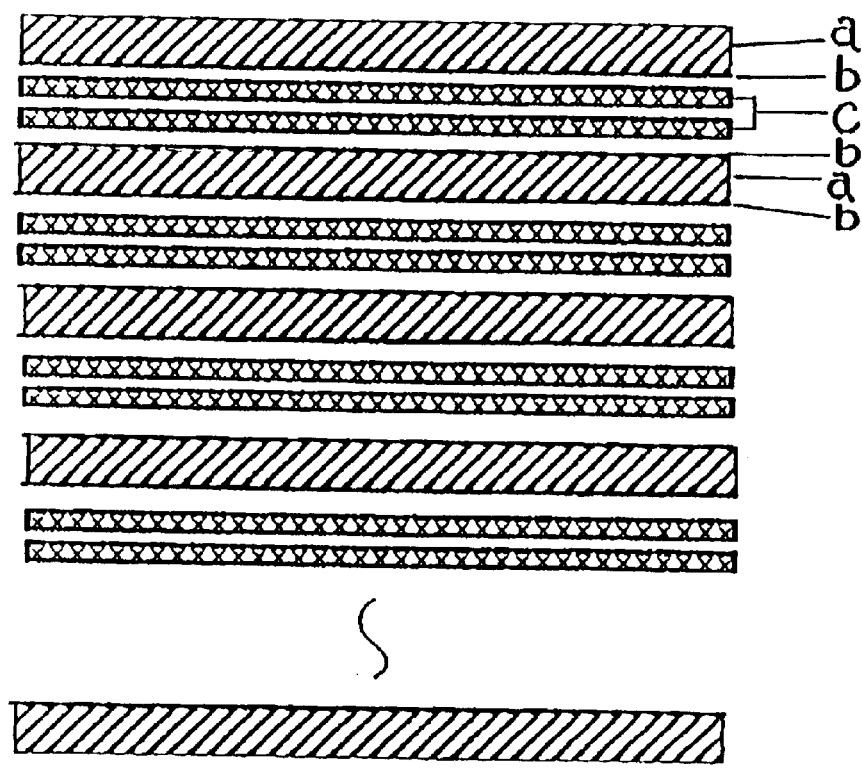
FIG. 4 is an illustration showing a constitution of laminate-formation of copper-clad boards in Example 9.

Symbols in FIG. 4 to FIG. 6 attached to the present specification have the following meanings. a: an aluminum foil to which a double-side-treated copper foil is to be attached, b: a copper foil both the surface of which are treated, c: prepreg, e: a glass-fabric-substrate laminate, f: a polyvinyl alcohol layer, g: an aluminum foil for a backup sheet, h: copper foil burrs, i: a through hole made with a carbon dioxide gas laser, j: an outer layer copper foil which is decreased in thickness by etching, k: a through hole plated with copper, l: an internal layer copper foil in which a deviation occurs, m: a copper-plated through hole portion of a four-layered board and n: a space between the wall of a through hole and a land copper foil.

The present invention relates to a double-side-treated-copper-foil-attached copper-clad board, which double-side-treated copper foil has a metallic-treatment layer which has a high absorption rate of a carbon dioxide gas laser energy and allows a hole to be made by directly irradiating the surface of the copper foil with a carbon dioxide gas laser. The above metallic-treatment layer is preferably a treated layer containing nickel or nickel and cobalt as essential components. When the double-side copper foil having the metallic-treatment layer and a thermosetting resin layer are laminate-formed under heat and pressure, an alloy of the metal of the metallic-treatment layer and the copper is formed. The above alloy has characteristic properties that the alloy is not peeled off by surface-friction in some degree. The metallic-treatment layer made on an outer surface of the copper foil is a metallic treatment which forms an alloy with copper at the time of laminate-formation under heat and pressure. The above alloy layer makes it easy to make a hole with a carbon dioxide gas laser. The metallic-treatment layer made on a copper foil surface is not specially limited. The metallic-treatment layer may be any treatment layer so long as it can form an alloy with copper at a heating time and a hole can be made by directly irradiating the alloy treatment surface with a carbon dioxide gas laser. Preferably, the metallic-treatment layer is a layer containing nickel or nickel and a cobalt metal as essential components. Metal other than these metals may be used.

As a nickel-treatment layer, a generally known layer such as a nickel deposition or a nickel plating may be used. A nickel alloy treatment can be selected from generally known treatments. For example, it includes an alloy of nickel with cobalt, and an alloy treatment of nickel-chromium-iron. Of course, there may be also used a treatment which is selected from among general cobalt treatments and zinc treatments and is capable of making a hole with a carbon dioxide gas laser.

The laminate-formation is generally carried out at 150 to 250° C. under 10 to 50 kgf/cm$^2$ for 1 to 5 hours.

The surface opposite to the metallic-treatment layer surface which is a shiny surface is treated with a generally known copper foil mat surface treatment. Of course, the above nickel metallic-treatment and the like may be formed on the mat surface. The surfaces of these treatment layers are preferably rustproofed for preventing any alterations due to the occurrence of rust or the like. The above treatment is not specially limited, while preferably a coating of an oxide of chromium or a mixed coating of an oxide of chromium with zinc and/or an oxide of zinc is formed.

A penetration hole and/or blind via hole having a small diameter can be easily made in a copper-clad board to which the above copper foil is applied, when a copper foil surface on the metallic layer side is directly irradiated with a carbon dioxide gas laser. On account of this, time required for removing a copper foil by etching in advance can be saved, and a hole having a small diameter can be efficiently made at a high rate. The output of a carbon dioxide gas laser is preferably selected from 10 to 60 mJ. The copper foil surface is directly irradiated with a carbon dioxide gas laser at an output energy in the above range, to form a penetration hole and/or a blind via hole having a diameter of 80 to 180 $\mu$m. After the hole is made, copper foil burrs occur in a hole portion. The burrs can be removed by mechanical polishing. However, etching with a chemical is preferred in view of the prevention of increases of dimensional changes. After the hole is made, a chemical is insufflated or it is sucked through the penetration hole, whereby parts of the surface copper foils are etched and removed and at the same time the copper foil burrs are etched and removed.

After the copper foil burrs are etched and removed, circuits are formed on front and reverse surfaces of a double-side copper-clad board obtained by copper plating and the resultant double-side copper-clad board is used to prepare a printed wiring board according to a conventional method. For making the circuits on the front and reverse surfaces fine, the copper foils on the front and reverse surfaces are arranged to have a remaining thickness of 2 to 7 $\mu$m, preferably 3 to 5 $\mu$m, after the etching treatment. As a result, defects such as a short circuit and a pattern breakage do not occur, and a high-density printed wiring board can be produced. Further, the processing rate is remarkably high as compared with the processing rate with a drill, productivity is fine and economic performances are excellent.

The present invention relates to a copper-clad board using a double-side-treated copper foil having a copper alloy layer on at least its shiny surface side which copper alloy layer is excellent in absorption rate of a carbon dioxide gas laser energy and allows a hole to be made by directly irradiating the copper foil surface with a carbon dioxide gas laser. In the double-side-treated copper foil, a metallic-treatment layer, preferably a metallic layer containing nickel or nickel and cobalt as essential components, is provided on at least an outer surface side, and a mat surface which is opposite to the above metallic layer and is to be bonded to a resin is provided with a generally known copper-foil-surface-treatment layer including the above metallic-treatment layer. Preferably, a copper-clad board or a multi-layered board is continuously or discontinuously prepared while a shiny surface of a double-side-treated copper foil having a metallic-treatment layer such as nickel, which shiny surface has the metallic-treatment layer, faces outside. The metallic-treatment layer forms an alloy with copper by heating at the time of preparing a copper-clad board, and the alloy layer makes it possible to make a hole by direct irradiation with a carbon dioxide gas laser without the occurrence of defective items even when the surface is rubbed.

The so-obtained copper-clad board and the multi-layered board have an alloy layer which is not peeled off by surface-friction in some degree, and a hole having a small diameter can be made in the copper-clad board and the multi-layered board by directly irradiating the copper foil surface with a carbon dioxide gas laser without the occurrence of defective items due to the peeling. After the hole is made, burrs of front and reverse copper foils and internal copper foils occur. In this case, an etching solution is insufflated or sucked through the hole under a high pressure, whereby the copper foil burrs of the outer layers are dissolved and removed. Thereafter, the entire surface is plated with copper by a conventional method, and circuits and the like are formed, to prepare a printed wiring board.

A generally known treatment for a copper foil board is carried out on a mat surface of the double-side-treated copper foil having a metallic-treatment layer, which mat surface is opposite to the surface having the metallic-treatment layer and is to be bonded to a resin of a copper-clad board. Of course, the treatment can be selected from a cobalt treatment, a zinc treatment, a nickel metallic-treatment or a nickel alloy treatment. For example, there is used a mat surface obtained by a method in which a copper foil surface is roughened by a plating of copper-cobalt-nickel and then a cobalt treatment or a cobalt-nickel plating treatment is carried out on the copper foil surface. Concave and convex shapes having a size of several $\mu$m are formed on the above copper foil surface to be used on a resin side. Concave and convex shapes may be present or absent on a shiny surface which has preferably a nickel treatment layer or a nickel and cobalt treatment layer and which is the front surface of the double-side-treated copper foil. However, in view of a treatment with a chemical for decreasing copper in thickness in a step to follow, it is preferred that the concave and convex shapes are as small as possible. Preferably, the concave and convex shapes have a size of 1 $\mu$m or less. After such a treatment is carried out, a generally known rustproof treatment such as a single coating treatment of a chromic acid compound or a mixed coating treatment of an oxide of chromium and zinc and/or an oxide of zinc is preferably carried out for preventing discoloration or rust. Then, a treatment with a silane-coupling agent is carried out as required. Concerning the thickness of the copper foil of the double-side-treated copper foil, there is used a copper foil obtained by treating both the surfaces of an electrolytic copper foil having a thickness of preferably 3 to 12 $\mu$m. A copper foil having a thickness of 9 to 35 $\mu$m, preferably 9 to 18 $\mu$is used as an internal board. The copper foil can be selected from a rolled copper foil and an electrolytic copper foil, while an electrolytic copper foil is preferred for a printed wiring board.

The copper-clad board prepared by using the double-side-treated copper foil of the present invention is a copper-clad board or a multi-layered board containing at least one copper layer. As a thermosetting resin composition layer, there may be used a thermosetting resin composition layer reinforced with a substrate, a film-based thermosetting resin composition layer, and a thermosetting resin composition layer containing no reinforcing substrate and formed of a resin alone. However, a thermosetting resin composition layer using a glass fabric substrate is preferred in view of stiffness. When a high density circuit is formed, a copper foil of which the initial thickness is thin may be used as a surface copper foil to be bonded. Preferably, however, a thick copper foil having a thickness of 9 to 12 $\mu$m is provided, laminate-formation is carried out, a hole is made with a carbon dioxide gas laser or the like, then, the surface copper foil is decreased in thickness with an etching solution until the surface copper foil has a thickness of 2 to 7 $\mu$m, preferably 3 to 5 $\mu$m, and a copper plating is carried out before use.

In the copper-clad board having a double-side-treated copper foil attached and the multi-layered board, provided by the present invention, a B-staged resin sheet or prepreg is laid down at a laminate-formation time and a double-side-treated copper foil is disposed thereon so as to allow a metallic-treatment layer surface of the double-side-treated copper foil to face outside.

In the present invention, there may be also used a double-side treated copper foil in which a B-staged thermosetting resin composition layer is attached to a mat surface of the copper foil of which a shiny surface is provided with a metallic-treatment layer having a high absorption rate of a carbon dioxide gas laser energy.

In the present invention, there may be also used a double-side-treated copper foil in which a thermosetting resin composition sheet is attached to a mat surface of the copper foil of which a shiny surface is provided with a metallic-treatment layer having a high absorption rate of a carbon dioxide gas laser energy. The thermosetting resin composition sheet is preferably a polyimide film in view of flexing characteristics.

The B-staged-resin-attached double-side-treated copper foil or the resin-sheet-attached double-side-treated copper foil is disposed such that the surface having a metallic-treatment layer faces outside, prepreg is disposed on the lower surface of the copper foil, stainless steel plates are placed on both the surfaces of the resultant set, and the resultant set is laminate-formed under heat and pressure preferably in vacuum, to prepare a single-side copper-clad board or a double-side copper-clad board. After the heating, the metallic-treatment layer containing nickel or nickel and cobalt on the surface at least partially forms an alloy with the copper. Further, in another embodiment, an internal board is provided, the copper foil surfaces of the internal board are chemically treated as required, a B-staged sheet or prepreg and a double-side-treated copper foil, a B-staged-resin-attached copper foil or a resin-sheet-attached copper foil are disposed on the surface of the internal board, and the resultant set is similarly laminate-formed.

The method of bonding a copper foil to a polyimide film is not specially limited. A generally known method is used. For example, there is employed a method in which an adhesive is applied onto at least one surface of a polyimide film and B-staged, a metallic-treatment copper foil is disposed on the above polyimide film such that the metallic-treatment layer faces to the direction opposite to the B-staged resin layer of the polyimide film, lamination is continuously carried out with a heating roll, and then, the resultant set is heated and cured at a temperature which does not cause a peeling with increasing a temperature step by step, to prepare a copper-clad board. Further, there is also employed a method in which copper is directly bonded to a polyimide film by spattering or the like without the use of an adhesive. In the method in which copper is directly bonded, thereafter, a nickel treatment or a nickel alloy treatment is carried out on the surface of the copper before use.

A generally known organic or inorganic woven fabric or non-woven fabric may be used as a substrate for the copper-clad board. Specifically, the inorganic fiber includes fibers of E glass, S glass, D glass and M glass. Further, the organic fiber includes fibers of a wholly aromatic polyamide, a liquid crystal polyester and polybenzazole. These may be used as mixtures. Films such as a polyimide film may be used.

The resin used in the copper-clad board of in the present invention can be selected from generally known thermosetting resins. Specific examples of the resin include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of the form of a through hole formed by the irradiation with a high-output carbon dioxide gas laser, it is preferred to use a thermosetting resin composition having a glass transition temperature of at least 150° C. In view of humidity resistance, anti-migration properties and electric characteristics after moisture absorption, a polyfunctional cyanate ester resin composition is preferred. The resin used in an internal board is also selected from similar resins.

A polyfunctional cyanate ester compound which is a suitable thermosetting resin component in the present invention refers to a compound having at least 2 cyanato groups per molecule. Specific examples thereof include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl) propane, 2,2-bis(3,5-dibromo-4-cyanatophenyl)propane, bis (4-cyanatophenyl)ether, bis(4-cyanatophenyl)thioether, bis (4-cyanotophenyl)sulfone, tris(4-cyanatophenyl)phosphite, tris(4-cyanatophenyl)phosphate and cyanates obtained by a reaction between novolak and halogen cyanide.

In addition to the above compound, there may be used polyfunctional cyanate ester compounds disclosed in Japanese Patent Publications Nos. 41-1928, 43-18468, 44-4791, 45-11712, 46-41112 and 47-26853 and JP-A-51-63149. Further, there may be used a prepolymer having a molecular weight of 400 to 6,000 and having a triazine ring formed by trimerizing cyanato group of any one of these polyfunctional cyanate ester compounds. The above prepolymer is obtained by polymerizing the above polyfunctional cyanate ester monomer in the presence of an acid such as a mineral acid or a Lewis acid, a base such as sodium alcoholate or tertiary amine, or a salt such as sodium carbonate as a catalyst. The prepolymer partially contains unreacted monomer and is in the form of a mixture of a monomer and a prepolymer, and the prepolymer in the above form is also suitably used in the present invention. Generally, it is dissolved in an organic solvent in which it is soluble, before use.

The epoxy resin is selected from generally known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin is selected from generally known polyimide resins. Specifically, it is selected from reaction products from polyfunctional maleimides and polyamines, and polyimides having terminal triple bonds, disclosed in JP-B-57-005406.

The above thermosetting resins may be used alone, while it is preferred to use these resins in a proper combination in view of a balance of properties.

Various additives may be added to the thermosetting resin composition in the present invention as required so long as the inherent properties of the composition are not impaired. The above additives include monomers having polymerizable double bonds such as unsaturated polyester, prepolymers of these, liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber, polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer, high-molecular-weight prepolymers or oligomers such as polycarbonate, polyphenylene ether, polysulfone, polyester and polyphenylene sulfide, and polyurethane. These additives are used as required. Further, various known additives such as an organic or inorganic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition used in the present invention may contain an insulating inorganic filler. Particularly for making a hole with a carbon dioxide gas laser, the amount of the above filler based on the thermosetting resin composition is 10 to 80% by weight, preferably 20 to 70% by weight, in order to make the form of a hole homogenous. The kind of the insulating inorganic filler is not specially limited. Specific examples thereof include talc, calcined talc, aluminum hydroxide, kaolin, alumina, wollastonite, and synthetic mica. These fillers are used and incorporated alone or in combination. A filler having a spherical form, an indeterminate form, an acicular form or a tabular form is used alone or a filler having one form of these forms is used in combination with at least one filler having another form of these forms.

The thermosetting resin composition used in the present invention undergoes curing itself under heat. However, when it is poor in workability and economic performances, etc., due to its low curing rate, a known heat-curing catalyst is incorporated into the thermosetting resin. The amount of the catalyst per 100 parts by weight of the thermosetting resin is 0.005 to 10 parts by weight, preferably 0.01 to 5 parts by weight.

The present invention provides a copper-clad board suited for making a hole with a carbon dioxide gas laser, which copper-clad board is obtained by attaching a protective sheet to a metallic-treatment layer surface of a double-side-treated copper foil with bonding at least part of the protective sheet to the copper foil, and disposing a B-staged-resin-layer-attached resin sheet on the other surface of the above copper foil.

That is, a protective sheet such as a metal foil or a film is attached to a shiny surface of the double-side-treated copper foil used in the present invention, which shiny surface is provided with a metallic-treatment layer and is to be an outer surface.

It is preferred to use a double-side-treated copper foil to which a protective sheet is attached, as at least a surface copper foil of a copper-clad board or a multi-layered board. After the protective-sheet-attached double-side-treated copper foil is used to prepare a copper-clad board or a multi-layered board, the protective sheet is peeled off to produce a printed wiring board.

Further, the protective sheet is attached to thus-obtained copper-clad board. After the protective sheet is peeled off, the upper surface of the copper-clad board is drilled with a mechanical drill to make a hole. Otherwise, the protective sheet may be retained as it is, and a hole can be made from the surface of the protective sheet by mechanical drilling. It is difficult to make a hole having a diameter of 180 $\mu$m or less by mechanical drilling. Therefore, a hole having such a diameter is made with a carbon dioxide gas laser after peeling the protective sheet off or while retaining the protective sheet.

The protective sheet to be bonded to a double-side-treated copper foil includes a metal foil or a heat-resistant film. The protective sheet is not specially limited. It is preferred to use a thermoplastic film having a thickness of 20 to 200 $\mu$m. The film is not specially limited, while those which bond to a copper foil at a laminate-formation time and do not peel off are not used. Specifically, there may be used a known heat-resistant film such as a polyester film, a Teflon (polytetrafluoroethylene) film, or a triacetate film, 4-methylpentene-1 film. The above film works to prevent the occurrence of a dent or the adhesion of a resin on a copper foil surface at a laminate-formation time. A stainless steel plate is disposed on the above film, and the resultant set is laminate-formed under heat and pressure preferably in vacuum, whereby a copper-clad board is prepared. In this case, thereafter, the film is peeled off from the copper-clad board, and then mechanical drilling or drilling with a carbon dioxide gas laser is carried out. At least portions, preferably end portions, of the protective film and the double-side-treated copper foil are bonded to each other for use. The bonding method may be selected from generally known methods. Examples thereof include a method in which an adhesive is used for the bonding and a method in which melting under heat is used for the bonding.

The metal foil is not specially limited. For example, an aluminum foil, an iron foil, or a copper foil is used. The thickness is not specially limited, while it is preferred to use a metal foil having a thickness of 20 to 200 $\mu$m when a continuous sheet is prepared.

For the laminate-formation, the thickness of the metal foil is preferably 200 to 500 $\mu$m. In this case, the laminate-formation can be carried out by the use of a metal foil such as aluminum in place of the stainless steel plate without using the stainless steel plate, and many copper-clad boards can be laminate-formed at once. That is, the present invention provides a copper-clad board suitable for making a hole with a carbon dioxide gas laser, which copper-clad board is obtained by using a metal-foil-carrier-attached copper foil in which one surface or both the surfaces of a double-side-treated copper foil is/are provided with metal foil(s) and the metal foil(s) is/are partially bonded to the copper foil.

The present invention using a metal foil carrier uses a double-side-treated copper foil. At least part of margins of the copper foil is bonded to a metal foil, preferably an aluminum carrier, and laminate-formation is carried out by the use of the copper foil to prepare a copper-clad board. The thus-obtained copper-clad board is almost free from a dent and the adherence of a resin on a copper foil surface so that, in the following formation of a fine pattern, the occurrences of a short circuit and a breakage caused by the dent and the adherence of the resin are prevented. As a result, in the formation of a high-density printed wiring board, the occurrence rate of defective items can be reduced.

A carrier such as aluminum is attached to the thus-obtained copper-clad board and, in this state, drilling may be carried out from the surface of the carrier with a mechanical drill. The carrier can be utilized for removing the generation of heat due to the drilling and preventing the occurrence of copper foil burrs. The mechanical drilling can not make a hole having a diameter of 80 $\mu$m to 180 $\mu$m. When a hole having such a diameter is made, therefore, the aluminum carrier is peeled off and the copper foil surface is directly irradiated with a carbon dioxide gas laser having an energy sufficient for processing a copper foil by means of its pulse oscillation to make a through hole and/or a blind via hole.

A double-side-treated copper foil having a metallic-treatment layer on at least one surface thereof is disposed on one surface or both the surface of a protective metal foil, at least part of a side end portion of the double-side-treated copper foil is bonded to the metal foil with an adhesive or the like, to obtain a board in which the double-side-treated copper foil(s) is/are attached to one surface or both the surfaces of the protective metal foil. As a metal foil, an aluminum foil, an iron foil and other metal foils or foils of alloys of these may be used. Preferably, an aluminum foil is used. The thickness of the metal foil is not specially limited. When the metal foil is used in place of the stainless steel plate at the laminate-formation time, the thickness of the metal foil is preferably 200 to 500 $\mu$m. In a laminate-formation, a board having a double-side-treated copper foil attached to one surface of a protective metal foil is disposed on each outermost surface so as to allow the double-side-copper foil surface to face a prepreg side, a board having double-side-treated copper foils attached to both the surfaces of a protective metal foil is disposed inside, a plurality of the boards having double-side-treated copper foils attached to both the surfaces of a protective metal foil are combined so as to sandwich prepreg between two of the above boards, the combined boards are placed between platens, and these materials are laminate-formed under heat and pressure preferably in vacuum. In a general laminate-formation, stainless steel plates are used at a laminate-formation time. The thickness of the stainless steel plate is 1 to 2 mm, and the number of materials to be placed between the platens is limited. Further, when the copper foils are disposed on both the sides of the prepreg, dusts are immixed, which causes a dent or the adherence of a resin. However, when the metal-foil-attached copper foil of the present invention is used, almost no immixture of a dust occurs. Further, since a metal foil to be used has a thickness of 200 to 500 $\mu$m, the number of the materials to be placed between the platens can be increased as compared with the case of using a stainless steel plate. Therefore, the use of the metal-foil-attached copper foil of the present invention is excellent in productivity.

A plurality of the metal-foil-carrier-attached double-side-treated copper foils of the present invention are set at a laminate-formation time, and the laminate-formation can be carried out without using the stainless steel plate. For this reason, the number of materials to be placed between platens of a press can be increased as compared with the use of the stainless steel plates having a thickness of 1 to 2 mm each, and the use of the double-side-treated copper foils having a metal foil carrier attached is excellent in productivity. After the laminate-formation, the metal foil is peeled off or not peeled off depending upon a processing method, that is, a method of making a hole, and the resultant laminate is used to prepare a printed wiring board. A hole can be made from the surface of the metal foil with a mechanical drill. When a hole is made with a carbon dioxide gas laser, the metal foil is removed and then the hole is made from the treatment copper foil surface.

The present invention provides a method of making a hole in a copper-clad board, wherein a penetration hole and/or a blind via hole is made by directly irradiating a metallic-treatment layer surface of the copper-clad board of the present invention with a carbon dioxide gas laser having an energy sufficient for processing a copper foil by means of its pulse oscillation.

When the penetration hole and/or the blind via hole is made with a carbon dioxide gas laser, a copper foil surface is directly irradiated with a carbon dioxide gas laser beam to process the copper foil and to make the hole.

The wavelength of a carbon dioxide gas laser is 9.3 to 10.6 $\mu$m. The energy of a carbon dioxide gas laser is preferably 5 to 60 mJ, more preferably 10 to 60 mJ, the most preferably 10 to 40 mJ. A predetermined number of pulses are irradiated to make a hole. When the penetration hole and/or the blind via hole is made, there may be employed either method of a method in which the same energy is irradiated from beginning to end to make a hole or a method in which the energy is increased or decreased during the processing to make a hole.

In the present invention, when the holes are made with a carbon dioxide gas laser, copper foil burrs occur around the holes. The method of removing the copper burrs occurring on the hole portions by etching is not specially limited, and it includes methods of dissolving and removing a metal surface with a chemical (called a SUEP method) disclosed, for example, in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-94491, JP-A-04-199592 and JP-A-04-263488. The etching rate is generally 0.02 to 1.0 $\mu$m/second. Further, when copper foil burrs of the internal and outer layers etched and removed, part of each copper foil surface is two-dimensionally etched and removed at the same time such that each copper foil has a remaining thickness of 2 to 7 $\mu$m, preferably 3 to 5 $\mu$m. In this case, fine patterns may be formed on copper foils plated with copper in a step to follow, and a high-density printed wiring board can be obtained.

It is possible to simply place a metal plate on the reverse surface of the copper-clad board for preventing the damage of the table of a laser machine, which damage is caused by a laser when a hole is penetrated. Preferably, however, a resin layer bonded to at least part of the surface of a metal plate is disposed and bonded to the reverse-surface copper foil of the copper-clad board and, after the penetration hole is made, the resin layer and the metal plate are peeled off.

Holes can be continuously made. In this case, there is a method in which, while a copper-clad sheet in a state of floating in the air is continuously fed, holes are made with a carbon dioxide gas laser.

In the majority of cases, a resin layer having a thickness of 1 $\mu$m remains on copper foil burr surfaces, to which a resin has been bonded, inside the hole made and on front and reverse surfaces. The resin layer may be removed before etching by a generally known treatment such as a desmearing treatment. When, however, a desmearing solution does not reach to the inside of a small-diameter hole, the remains of the resin layer remaining on an internal layer copper foil surface occur, which cause a failure in connection to a copper plating in some cases. Therefore, more preferably, first, the inside of a hole is treated in a gaseous phase to remove the remaining resin layer completely and then the copper foil burrs of the front and reverse surfaces are removed by etching.

The gaseous phase treatment can be selected from generally known methods such as a plasma treatment and a treatment with low ultraviolet light. The plasma treatment uses low-temperature plasma prepared by partially exciting and ionizing molecules with a high-frequency power source. In the plasma treatment, a high-rate treatment using ionic impact or a moderate treatment with radical species is generally used. As a processing gas, a reactive gas or an inert gas is used. As a reactive gas, oxygen is mainly used, and a surface is chemically treated. As an inert gas, argon gas is mainly used. Physical surface treatment is carried out with argon gas, or the like. The physical treatment cleans a surface with an ionic impact. The low ultraviolet light is ultraviolet light in a short wavelength region. The resin layer is decomposed and removed by irradiation with a wavelength in a short wavelength region having a peak at 184.9 nm or 253.7 nm.

The inside of a hole may be plated with copper by a general method. Further, part, preferably at least 80% by volume, of the inside of a hole may be filled with a copper plating.

Effect of the Invention

In the copper-clad board of the present invention, when the copper-clad board is prepared by forming a metallic-treatment layer on a copper foil surface and laminate-forming the copper foil and a thermosetting resin composition layer under heat and pressure, the metallic-treatment layer and the copper are converted to an alloy, whereby there can be formed an alloy layer which is not easily peeled off when the surface treatment of the copper foil is rubbed. Owing to the formation of the alloy, when a penetration hole and/or a blind via hole having a diameter of 80 to 180 $\mu$m is made in the copper-clad board by the direct irradiation of a carbon dioxide gas laser beam, the hole can be made without the occurrence of any defective items due to the peelings of the copper foil surface-treatment layer for facilitating the absorption of a carbon dioxide gas laser. Further, the processing rate is remarkably high as compared with the processing rate by mechanical drilling, and productivity is remarkably improved. Then, copper foil burrs occurring in the hole portion are dissolved and removed and concurrently part of each surface copper foil is dissolved so as to have a remaining thickness of 2 to 7 $\mu$m, preferably 3 to 5 $\mu$m, whereby a fine pattern can be made by copper plating in a step to follow. There may be produced a high-density printed wiring board.

Further, the incorporation of the insulating inorganic filler makes the form of a hole fine. Fewer spaces occur between land copper foils for front and reverse surfaces and a hole as compared with a case where holes are made in copper foils on front and reverse surfaces by etching and then holes are made with a carbon dioxide gas laser. Further, when a printed wiring board is obtained by using, as a thermosetting resin composition, a resin composition containing a polyfunctional cyanate ester compound and/or a prepolymer of said cyanate ester as essential components, the printed wiring board is excellent in heat resistance and anti-migration properties.

In the present invention, a copper-clad laminate using a double-side-treated copper foil in which a B-staged thermosetting resin layer or a polyimide film is attached to a mat surface of the copper foil opposite to a shiny surface provided with a metallic treatment capable of making a hole by direct irradiation with a carbon dioxide gas laser energy, is almost free from a dent or the adherence of a resin. In the following formation of a pattern, a short circuit and a pattern breakage are not caused by these defects, and a high-density printed wiring board can be produced.

When a laminate-formation is carried out by the use of carrier-attached copper foils obtained by bonding at least a portion of the margins of a double-side-treated copper foil to a carrier, provided by the present invention, to obtain a plurality of copper-clad laminates, no stainless steel plates are required for the laminate-formation. The thus-obtained copper-clad laminates have almost no dent, no adherence of a resin and no flaws. Therefore, in the following formation of a pattern, a short circuit and a pattern breakage are not caused by these defects, and a high-density printed wiring board can be produced.

According to the present invention, there is provided a method of making a through hole and/or a blind via hole having a diameter of 80 to 180 $\mu$m in a copper-clad laminate obtained by providing a double-side-treated copper foil as at least an outer layer and carrying out a laminate-formation, by directly irradiating the surface of the copper-clad laminate with a carbon dioxide gas laser energy sufficient for processing a copper foil. According to the method of the present invention, there is provided a hole-making method, of which the processing rate is remarkably high as compared with the processing rate by mechanical drilling, and the productivity is remarkably improved. Thereafter, copper foil burrs occurring in the hole portion are dissolved and removed and at the same time part of each surface copper foil is dissolved such that each surface copper foil has a remaining thickness of preferably 2 to 7 μm, whereby a fine pattern can be formed in the following copper plating, and a high-density printed wiring board can be produced.

EXAMPLES

The present invention will be explained specifically with reference to Examples and Comparative Examples hereinafter, in which "part" stands for "part by weight" unless otherwise specified.

Example 1

700 Parts of 2,2-bis(4-cyanatophenyl)propane, 200 parts of 1,4-dicyanatebenzene and 100 parts of bis(4-maleimidephenyl)methane were melted at 150° C. and allowed to react for 5 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture were added 1,000 parts of an inorganic filler (trade name: Calcined Talc, average particle diameter 4 μm, supplied by Nippon Talc K.K.), 1,000 parts of aluminum hydroxide (average diameter 3 μm) and 8 parts of a black pigment, and these materials were homogeneously stirred and mixed to prepare a varnish. The above varnish was used to impregnate a 100 μm thick glass woven fabric, and the impregnated glass woven fabric was dried at 150° C. to prepare prepregs having a gelation time of 102 seconds at 170° C. and having a glass fabric content of 50% by weight.

A nickel treatment having a thickness of 3 μm was formed on a shiny surface of a 9 μm thick electrolytic copper foil. Two of such copper foils were prepared. Four of the above prepregs were stacked, the above electrolytic copper foils were placed on the upper and lower surfaces of the stacked prepregs, one on one surface and the other on the other surface, 1.5 mm thick stainless steel plates were disposed thereon, and the resultant set was laminate-formed at 200° C. at 20 kgf/cm² under a vacuum of 30 mmHg or less for 2 hours, to give a double-side copper-clad laminate. Separately, a resin of a polyvinyl alcohol in water was applied to one surface of a 50 μm thick aluminum foil, the applied resin was dried at 110° C. for 20 minutes to prepare a backup sheet having a 20 μm thick coating.

The surface of the double-side copper-clad laminate was rubbed with a fabric ten times, then, the backup sheet was placed on the lower surface of the double-side copper-clad laminate, and the backup sheet was bonded to the double-side copper-clad laminate with a heating roll at 100° C. at a linear pressure of 3 kgf/cm. The upper surface of the resultant double-side copper-clad laminate was 6 shots irradiated directly by pulse oscillation with a carbon dioxide gas laser at an output of 13 mJ to form 900 penetration holes having a diameter of 100 μm in a 50 mm×50 mm square area in each of 70 blocks, 63,000 holes in total. The backup sheet on the lower surface was removed. A SUEP solution was insufflated at a high rate to dissolve and remove burrs on the front and reverse surfaces and at the same time to dissolve the surface copper foils until the surface copper foils had a remaining thickness of 4 μm each. Copper plating was carried out to form a plating layer having a thickness of 15 μm on each surface. Thereafter, circuits (line/space=50/50 μm), pads for solder balls, and the like were formed by a conventional method, portions other than at least a semiconductor chip portion, pad portions for bonding and solder ball pad portions were coated with a plating resist, and nickel plating and gold plating were carried out, to produce a printed wiring board. Table 1 shows the evaluation results to the printed wiring board.

Example 2

300 Parts of an epoxy resin (trade name; Epikote 1001, supplied by Yuka-Shell Epoxy K.K.) and 700 parts of an epoxy resin (trade name: ESCN-220F, supplied by Sumitomo Chemical Co., Ltd.), 35 parts of dicyandiamide and 1 part of 2-ethyl-4-methylimidazole were dissolved in mixed solvents of methyl ethyl ketone and dimethylformamide, and these materials were uniformly stirred and mixed, to give a varnish. The varnish was used to impregnate a 100 μm thick glass woven fabric and dried to give prepreg A having a gelation time of 150 seconds and having a glass fabric content of 48% by weight, and the varnish was used to impregnate a 50 μm thick glass woven fabric and dried to give prepregs B having a gelation time of 170 seconds and having a glass fabric content of 31% by weight.

One sheet of the prepreg A was provided, general electrolytic copper foils having a thickness of 12 μm each were placed on the front and reverse surfaces of the prepreg A, one on one surface and one on the other surface, and the resultant set was laminate-formed at 190° C. at 20 kgf/cm² under a vacuum of 30 mmHg or less, to obtain a double-side copper-clad laminate. Circuits were formed on the front and reverse surfaces of the laminate, and a treatment to form black copper oxide was carried out. Separately, a nickel-cobalt layer having a thickness of 1.5 μm was formed on a shiny surface of a 12 μm thick electrolytic copper foil. Two sheets of such electrolytic copper foils were prepared. Thereafter, the prepregs B were disposed on the upper and lower surfaces of the above laminate, one on one surface and one on the other surface, the above electrolytic copper foils were placed thereon and the resultant set was laminate-formed in the same manner as in Example 1, to prepare a four-layered board. The surface of the four-layered board was rubbed with a fabric ten times, the same backup sheet as that in Example 1 was placed on the lower surface of the above board, and the backup sheet was bonded to the four-layered board with a heating roll at 100° C. at 5 kgf/cm. The upper surface of the resultant four-layered board was 4 shots irradiated with a carbon dioxide gas laser at an output of 10 mJ to form penetration holes having a diameter of 120 μm. Further, the upper surface was 2 shots irradiated with a carbon dioxide gas laser at an output of 12 mJ to form blind via holes having a diameter of 90 μm. The entire board was treated by the SUEP treatment, to dissolve and remove copper foil burrs and at the same time to dissolve and remove the surface copper foils until the surface copper foils had a remaining thickness of 3 μm each. Then, copper plating was carried out in the same manner as in Example 1. Then, a printed wiring board was prepared in the same manner as in Example 1. Table 1 shows the evaluation results.

Comparative Example 1

In the preparation of a copper-clad board in Example 1, general copper foils were used to prepare a copper-clad board. Attempts were made to make holes in the copper-clad board with a carbon dioxide gas laser under the same condition. However, the laser beam was reflected so that the energy of the carbon dioxide gas laser was not absorbed. No holes were made.

Comparative Example 2

In Example 1, a general copper foil which had no nickel treatment layer was used, and laminate formation was carried out to prepare a copper-clad laminate. The surface thereof was treated to form black copper oxide. Thereafter, the surface was rubbed with a fabric ten times to grind the black copper oxide treatment, and the resultant surface was irradiated with a carbon dioxide gas laser under the same condition as that in Example 1. Almost no holes were made.

Comparative Example 3

2,000 Parts of an epoxy resin (trade name: Epikote 5045, supplied by Yuka-Shell Epoxy K.K.), 70 parts of dicyandiamide and 2 parts of 2-ethyl-4-methylimidazole were dissolved in mixed solvents of methyl ethyl ketone and dimethylformamide, further, 800 parts of the same insulating inorganic filler as that used in Example 1 was added, and these materials were stirred and uniformly dispersed, to give a varnish. The varnish was used to impregnate a 100 μm thick glass woven fabric and dried to give prepregs C having a gelation time of 140 seconds and having a glass fabric content of 52% by weight, and the varnish was used to impregnate a 50 μm thick glass woven fabric and dried to give prepregs D having a gelation time of 180 seconds and having a glass fabric content of 33% by weight. Two of the prepregs C were stacked, general electrolytic copper foils having a thickness of 12 μm were placed on both the surfaces of the stacked prepregs, one on one surface and one on the other surface, and the resultant set was laminate-formed at 180° C. at 20 kgf/cm² under a vacuum of 30 mmHg or less, to obtain a double-side copper-clad laminate. Circuits were formed on the front and reverse surfaces of the copper-clad laminate, and a treatment to form black copper oxide was carried out. The prepregs D were placed on the upper and lower surfaces of the resultant copper-clad laminate, one on one surface and one on the other surface, general electrolytic copper foils were placed thereon, and the resultant set was laminate-formed to obtain a four-layered board. Penetration holes having a diameter of 150 μm each were made in the four-layered board by mechanical drilling. For making via holes, the copper foil surface was directly irradiated with a carbon dioxide gas laser at an output of 30 mJ. However, no holes were made. A copper plating was carried out without carrying out the SUEP treatment, and a printed wiring board was obtained in the same manner as in Example 1. Table 1 shows the evaluation results.

Comparative Example 4

The same double-side copper-clad laminate as that in Example 2 was provided, copper foils having a diameter of 100 μm on the front and reverse surfaces of the copper-clad laminate as an internal layer in positions where through holes were to be made were etched and removed, circuits were formed, then, the copper foil surface was treated to form black copper oxide, the same prepregs B as that in Example 2 were placed on both the outsides of the laminate, one on one surface and one on the other surface, general electrolytic copper foils having a thickness of 12 μm were placed thereon, and the resultant set was laminate-formed under the same condition as that in Example 2, to obtain a four-layered copper-clad board. Holes having a diameter of 100 μm each were made in the surface copper foils on the front and reverse surfaces of the above multi-layered board in positions where penetration holes were to be made by etching and removing the surface copper foils (FIG. 6(1)). The front surface of the resultant multi-layered board was 4 shots irradiated with a carbon dioxide gas laser at an output of 15 mJ, to make penetration holes (FIG. 6(2)). Thereafter, the SUEP treatment was not carried out similarly to Comparative Example 3, a desmearing treatment was carried out once, a copper plating was carried out to form a plating layer of 15 μm (FIG. 6(3)), circuit were formed on the front and reverse surfaces, and a printed wiring board was similarly produced. Table 1 shows the evaluation results.

TABLE 1

| | Examples | | Comparative Examples | | |
|---|---|---|---|---|---|
| | 1 | 2 | 2 | 3 | 4 |
| Formation of penetration holes (%) | 100 | 100 | 6 | 100 | 100 |
| Spaces between land copper foils on the front and reverse surfaces and a hole (μm) | 0 | 0 | — | 0 | 27 |
| Positional deviation between the hole and the internal layer copper foil (μm) | — | 0 | — | — | 39 |
| Pattern breakage and short circuits (pieces) | 0/200 | 0/200 | — | 52/200 | 53/200 |
| Glass transition temperature (° C.) | 210 | 160 | — | 139 | 160 |
| Through hole-heat cycle test (%) | | | | | |
| 100 cycles | 1.1 | 1.3 | — | 1.6 | 4.2 |
| 300 cycles | 1.3 | 1.7 | — | 1.8 | 9.6 |
| Processing time period for making holes (minute) | 19 | 13 | — | 630 | — |
| Anti-migration properties (HAST) (Ω) | | | | | |
| Ordinary state | $5 \times 10^{11}$ | — | — | $1 \times 10^{11}$ | — |
| 200 hours | $7 \times 10^{8}$ | | | $<10^{8}$ | |
| 500 hours | $6 \times 10^{8}$ | | | — | |
| 700 hours | $4 \times 10^{8}$ | | | | |
| 1000 hours | $2 \times 10^{8}$ | | | | |

<Measurement Methods>

1) Spaces of hole positions on the front and reverse surfaces, and number of formed penetration holes 900 holes having a diameter of 100 μm (carbon dioxide gas laser) or 900 holes having a diameter of 150 μm (mechanical drill), were made in one block, and holes were made in 70 blocks (63,000 holes in total).

The holes were made with a carbon dioxide gas laser or with a mechanical drill. Table 1 shows time periods required for making 63,000 holes in a copper-clad board, the maximum values of deviations between the copper foils for lands on the front and reverse surfaces and the holes and the maximum values of deviations between the internal layer copper foil and wall of the hole. The number of all the holes formed was checked through a magnifier.

2) Circuit Pattern Breakage and Short Circuit

In Examples and Comparative Examples, boards having no holes made were similarly prepared, comb-like patterns having a line/space=50/50 μm were prepared, and then 200 patterns were visually observed through a magnifier after etching. A numerator shows the total of patterns which had a circuit pattern breakage and a short circuit.

3) Glass Transition Temperature

Measured by a DMA method according to JIS C6481.

4) Through Hole-heat Cycle Test

A land having a diameter of 250 μm was formed in each through hole, and 900 holes were connected alternately from one surface to the other surface. One heat cycle consisted of immersion in solder at 260° C. for 30 seconds→room temperature for 5 minutes, and 300 cycles were repeated. Table 1 shows the maximum value of change ratios of resistance values. The inside of each through hole and the surface layers were filled or coated with a resist for preventing the adherence of a solder.

5) Anti-migration Properties

First, copper-plated through holes having a diameter of 100 μm (carbon dioxide gas laser) or having a diameter of 150 μm (mechanical drilling) and having a land having a diameter of 250 μm are alternately connected from one surface to the other surface. In this case, through holes were connected one by one in each surface. Secondly, similar through holes were connected in the same manner. The first group of the "connected through holes" and the second group of the "connected through holes" were disposed in parallel so as to have a hole-hole distance of 150 μm, and these were regarded as one set. 100 sets were prepared. These were treated at 130° C. at 85% RH under 1.8 VDC for a predetermined time and then taken out, and an insulation resistance between the through holes disposed in parallel was measured.

Example 3

900 Parts of 2,2-bis(4-cyanatophenyl)propane and 100 parts of bis(4-maleimidophenyl)methane were melted at 150° C. and allowed to react for 4 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Yuka-Shell Epoxy K.K.), 600 parts of a cresol novolak type epoxy resin (trade name: ESCN-220F, supplied by Sumitomo Chemical Co., Ltd.) and 500 parts of a phenol novolak type epoxy resin (trade name: DEN439, supplied by Dow Chemical), and these materials were homogeneously dissolved and mixed. Further, as a catalyst, 0.4 part of zinc octylate was added, and these materials were dissolved and mixed. To the resultant mixture were added 2,000 parts of an inorganic filler (trade name: Calcined Talc, supplied by Nippon Talc K.K., average particle diameter 4 μm) and 8 parts of a black pigment, and these materials were homogeneously stirred and mixed to prepare a varnish. The above varnish was used to impregnate a 100 μm thick glass woven fabric, and the impregnated glass woven fabric was dried at 150° C. to prepare prepregs E having a gelation time of 104 seconds at 170° C. and having a glass fabric content of 51% by weight.

Separately, a nickel alloy treatment (Y treatment, also called LD foil, supplied by Japan energy) having a thickness of 1 μm was formed on a shiny surface of an electrolytic copper foil having a length of 1,000 m and a thickness of 11 μm. The above varnish was continuously applied to a mat surface of the electrolytic copper foil which mat surface was opposite to the surface having the nickel alloy treatment and was to be used for the bonding of a resin, and the applied varnish was dried to form a B-staged resin layer having a thickness of 60 μm and a gelation time of 45 seconds, whereby a B-staged-resin-attached sheet was obtained. The B-staged-resin-attached sheet was cut to a size of 530×530 mm.

Two of the above prepregs E were stacked, general electrolytic copper foils having a thickness of 12 μm were placed on both the surfaces of the stacked prepregs E, one on one surface and one on the other surface, and the resultant set was laminate-formed at 200° C. at 20 kgf/cm$^2$ under a vacuum of 30 mmHg or less, to give a double-side copper-clad laminate. Circuits were formed on both the surfaces of the double-side copper-clad laminate, a treatment to form black copper oxide was carried out, the B-staged-resin-attached sheets having the double-side-treated copper foil attached were placed on both the surfaces of the resultant copper-clad laminate such that the resin layer of each B-staged-resin-attached sheet faced to an internal board side, and 1.5 mm thick stainless steel plates were placed thereon. These procedures were repeated. Fifteen sets of these were placed between platens, and these sets were laminate-formed at 200° C. at 20 kgf/cm$^2$ under a vacuum of 30 mmHg or less for 2 hours, to obtain multi-layered boards.

The same backup sheet as that in Example 1 was placed on the lower surface of the multi-layered board, the upper copper foil surface was 3 shots irradiated directly by pulse ossification with a carbon dioxide gas laser at an output of 10 mJ and 3 shots irradiated at an output of 20 mJ, to make 900 penetration holes having a diameter of 100 μm each in a 50×50 mm square size in each of 70 blocks, 6,3000 holes in total. Further, the resultant surface was 2 shots irradiated at an output of 13 mJ to make blind via holes having a diameter of 100 μm.

The backup sheet on the lower surface was peeled off, the board was placed and treated in a plasma apparatus, and then a SUEP solution was insufflated at a high rate, to dissolve and remove copper foil burrs occurring on the hole portions on the front and reverse surfaces and at the same time to dissolve the surface copper foils until the surface copper foils had a remaining thickness of 4 μm each. After a desmearing treatment was carried out, copper plating was carried out to form a plating layer having a thickness of 15 μm on each surface. Thereafter, circuits (line/space=50/50 μm), pads for solder balls, and the like were formed by a conventional method, portions other than at least a semi-conductor chip portion, pad portions for bonding and solder ball pad portions were coated with a plating resist, and nickel plating and gold plating were carried out, to produce a printed wiring board. Table 2 shows the evaluation results to the printed wiring board.

Example 4

A nickel treatment was formed on a shiny surface of a double-side-treated copper foil having a thickness of 9 μm and a width of 540 mm. The same varnish as that prepared in Example 2 was continuously applied to a mat surface of the double-side-treated copper foil opposite to the surface having the nickel treatment, and the applied varnish was dried to form a B-staged resin layer having a thickness of 50 μm and a gelation time of 55 seconds, whereby a B-staged resin-attached sheet was obtained.

One sheet of the same prepreg A having a size of 530×530 mm as that used in Example 2 was provided, general electrolytic copper foils having a thickness of 12 μm were placed on both the surfaces of the prepreg A and the resultant set was laminate-formed at 190° C. at 20 kgf/cm$^2$ under a vacuum of 30 mmHg, to give a double-side copper-clad laminate. Circuits were formed on both the surfaces of the copper-clad laminate, a treatment to form black copper oxide was carried out, the double-side-treated-copper-foilattached B-staged-resin sheets which were cut to so as to have a size of 540×540 mm each were placed on the upper and lower surfaces of the resultant copper-clad laminate, one on one surface and one on the other surface, and the resultant set was similarly laminate-formed under heat under pressure, to form a four-layered board. The same backup sheet as that prepared in Example 1 was disposed on the lower surface of the four-layered board, and the copper foil surface was 2 shots irradiated with a carbon dioxide gas laser at an output of 15 mJ and 2 shots irradiated at an output of 20 mJ, to make penetration holes.

Further, the resultant surface was 2 shots irradiated with a carbon dioxide gas laser at an output of 12 mJ to make via holes. The backup sheet was removed, SUEP treatment was entirely carried out to dissolve and remove the copper foils on the front and reverse surfaces until the copper foils had a remaining thickness of 3 μm each. Then, a desmearing treatment was carried out with a potassium permanganate aqueous solution, copper plating was similarly carried out, and a printed wiring board was similarly obtained. Table 2 shows the evaluation results.

Comparative Example 5

A four-layered board was prepared in the same manner as in Example 3 except that general electrolytic copper foils (JTC-LP foil, supplied by Japan energy) were used as surface copper foils. Nothing was attached to the surface of the four-layered board, and attempts were made to make holes in the four-layered board with a carbon dioxide gas laser under the same condition as that in Example 3. However, the absorption of the energy of the carbon dioxide gas laser was poor, and the laser beam was reflected. No holes were made.

Comparative Example 6

The surface of the same multi-layered board as that prepared in Comparative Example 3 was treated to form black copper oxide, then, the resultant surface was rubbed with a fabric ten times to grind the above treatment. The surface was irradiated with a carbon dioxide gas laser under the same condition as that in Comparative Example 3. Almost no holes were made.

TABLE 2

|  | Examples | | Comparative Examples |
|---|---|---|---|
|  | 3 | 4 | 6 |
| Formation of penetration holes (%) | 100 | 100 | 9 |
| Spaces between land copper foils on the front and reverse surfaces and a hole (μm) | 0 | 0 | — |
| Positional deviation between the hole and the internal layer copper foil (μm) | — | 0 | — |
| Pattern breakage and short circuits (pieces) | 0/200 | 0/200 | — |
| Glass transition temperature (° C.) | 235 | 160 | 235 |
| Through hole-heat cycle test (%) | | | |
| 100 cycles | 1.4 | 1.5 | — |
| 300 cycles | 1.7 | 1.9 | — |
| Processing time period for making holes (minute) | 19 | 14 | — |
| Anti-migration properties | | | |

TABLE 2-continued

|  | Examples | | Comparative Examples |
|---|---|---|---|
|  | 3 | 4 | 6 |
| (HAST) (Ω) | | | |
| Ordinary state | $5 \times 10^{11}$ | — | — |
| 200 hours | $6 \times 10^{8}$ | | |
| 500 hours | $5 \times 10^{8}$ | | |
| 700 hours | $3 \times 10^{8}$ | | |
| 1000 hours | $2 \times 10^{8}$ | | |

Example 5

A varnish was prepared in the same manner as in Example 3 except that the amount of the phenol novolak type epoxy resin (trade name: DEN439, supplied by Dow Chemical) was changed from 500 parts to 800 parts.

Separately, a nickel alloy treatment (Y treatment, also called LD foil, supplied by Japan energy) having a thickness of 3 μm was formed on a shiny surface of a double-side-treated electrolytic copper foil having a length of 1,000 m and a thickness of 9 μm. The above varnish was continuously applied to a mat surface of the electrolytic copper foil which was opposite to the surface having the nickel alloy treatment, and dried to form a B-staged resin layer having a thickness of 60 μm and a gelation time of 45 seconds, whereby a B-staged-resin-attached double-side-treated copper foil sheet was obtained. The B-staged-resin-attached double-side-treated copper foil sheet was cut to a size of 530×530 mm, to prepare a B-staged-resin-attached double-side-treated copper foil sheet.

Two of the above B-staged-resin-attached double-side-treated copper foil sheets having the above size were provided, a glass woven fabric substrate having a thickness of 25 μm was placed between these double-side-treated copper foil sheets such that the resin layers of these double-side-treated copper foil sheets faced to each other, 1.5 mm thick stainless steel plates were placed on outsides, and the resultant set was heated and cured at 200° C. at 30 kgf/cm² under a vacuum of 30 mmHg or less for 2 hours, to give a double-side copper-clad board.

The same backup sheet as that prepared in Example 1 was placed on the lower surface of the double-side copper-clad board, the upper surface was directly 3 shots irradiated at an output of 15 mJ by pulse ossification with a carbon dioxide gas laser, to make 900 penetration holes having a diameter of 100 μm in a 50 mm×50 mm square area in each of 70 blocks, 63,000 holes in total. The backup sheet on the lower surface was separated, and a SUEP solution was insufflated at a high rate, to dissolve and remove copper foil burrs on the front and reverse surfaces and at the same time to dissolve the surface copper foils until the surface copper foils had a remaining thickness of 4 μm each. After a desmearing treatment was carried out, copper plating was carried out to form a plating layer having a thickness of 15 μm on each surface. Thereafter, circuits (line/space=50/50 μm), pads for solder balls, and the like were formed by a conventional method, portions other than at least a semi-conductor chip portion, pad portions for bonding and solder ball pad portions were coated with a plating resist, and nickel plating and gold plating were carried out, to produce a printed wiring board. Table 3 shows the evaluation results to the printed wiring board.

Example 6

A 4 μm thick nickel treatment to which an adhesive (trade name, Nikaplex F63V, supplied by Nikkan Kogyo K.K.) was attached was formed on an electrolytic copper foil such that the electrolytic copper foil had a total thickness of 12 μm. Two sheets of such electrolytic copper foils were prepared. These electrolytic copper foils were disposed on both the surfaces of a polyimide film having a thickness of 125 μm, these electrolytic copper foils were laminated and bonded to the polyimide film at a temperature of 120° C. at a linear pressure of 5 kgf/cm, and the resultant set was heated and cured at 60° C. for 6 hours, at 80° C. for 10 hours and at 120° C. for 8 hours, to prepare a copper-clad board continuously. The copper-clad board was floated in the air in a carbon dioxide gas laser machine, the copper foil surface was 3 shots irradiated with the carbon dioxide gas laser at an output of 20 mJ, to make penetration holes. SUEP treatment was entirely carried out to dissolve and remove the surfaces until the surfaces had a remaining thickness of 3 μm each. Then, copper plating was carried out in the same manner as in Example 5, and an printed wiring board was similarly obtained. Table 3 shows the evaluation results.

Comparative Example 7

In Example 6, no nickel treatment was carried out, and holes having a diameter of 100 μm were made by using a punching machine. When punching was repeated 951 times, its pin was broken. The copper-clad board became defective.

Comparative Example 8

A printed wiring board was obtained in the same manner as in Example 6 except that holes having a diameter of 150 μm were made in copper-clad boards, one sheet by one sheet, with a mechanical drill, and that no SUEP treatment was carried out. Table 3 shows the evaluation results.

TABLE 3

|  | Examples | | Comparative Examples |
| --- | --- | --- | --- |
|  | 5 | 6 | 8 |
| Pattern breakage and short circuits (pieces) | 0/200 | 0/200 | 24/200 |
| Glass transition temperature (° C.) | 214 | — | — |
| Through hole-heat cycle test (%) | | | |
| 100 cycles | 1.5 | 1.8 | 2.9 |
| 300 cycles | 2.5 | 2.1 | 5.0 |
| Processing time period for making holes (minute) | 10 | 11 | 630 |

Example 7

The same varnish as that prepared in Example 3 was used to impregnate a glass woven fabric having a thickness of 100 μm and dried at 150° C. to obtain prepreg having a gelation time of 102 seconds at 170° C. and a glass fabric content of 50% by weight.

A nickel alloy treatment (c) (Y treatment, also called LD foil, supplied by Japan energy) having a thickness of 3 μm was formed on a shiny surface of an double-side-treated electrolytic copper foil (b) having a length of 1,000 m, a width of 530 mm and a thickness of 9 μm. The double-side-treated copper foil (b) was disposed on an aluminum foil (a) having a thickness of 300 μm so as to allow the nickel alloy-treatment surface (c) to face the aluminum foil side, marginal portions having a size of 5 mm each at intervals of 50 mm in both end portions in the 530 mm-wide width of the double-side-treated copper foil were bonded to the aluminum foil with an adhesive, to prepare an aluminum foil-attached double-side-treated copper foil in which the double-side-treated copper foil was bonded to one surface of the aluminum foil.

The above varnish was continuously applied on the copper foil surface of the aluminum foil-attached double-side-treated copper foil opposite to the aluminum foil-attached surface and dried to form a B-staged resin layer having a thickness of 60 μm and a gelation time of 45 seconds at 170° C., whereby an aluminum foil-attached and single-side copper-foil-attached resin sheet (A) in which the B-staged-resin(t)-attached double-side-treated copper foil was bonded to one surface of the aluminum foil, was obtained (FIG. 1(1)). Further, the varnish was continuously applied to a mat surface of the double-side-treated copper foil (opposite to the surface having the nickel alloy treatment) and dried to form a B-staged resin layer (t) having a thickness of 60 μm and a gelation time of 45 seconds, whereby a B-staged resin(t)-attached copper foil sheet was obtained. The B-staged resin(t)-attached copper foil sheet was continuously bonded to the aluminum foil of the above aluminum foil-attached and single-side copper-foil-attached resin sheet (A) with an adhesive in marginal portions having a size of 5 mm each at intervals of 50 mm in each end portion, to prepare an aluminum-foil-containing double-side B-staged-resin-attached-copper-foil-attached sheet (B) in which the B-staged-resin-attached copper foils were bonded to both the surfaces of the aluminum foil (FIG. 1(2)).

Two sheets of the above prepregs were stacked and general electrolytic copper foils having a thickness of 12 μm each were placed on both the surfaces of the stacked prepregs and the resultant set was laminate-formed at 200° C. at 20 kgf/cm² under a vacuum of 30 mmHg or less, to obtain a double-side copper-clad laminate. Circuits were formed on both the surfaces of the double-side copper-clad laminate, and a treatment to form black copper oxide was carried out, to prepare an internal board (e). One sheet of the aluminum foil-attached and single-side copper-foil-attached resin sheet (A) was placed on one surface of the internal board (e), one sheet of the aluminum-foil-containing double-side B-staged-resin-attached-copper-foil-attached sheet (B) was placed on the other surface of the internal board (e), then, one sheet of the internal board (e) was disposed on the above sheet (B), then, one sheet of the aluminum-foil-containing double-side B-staged-resin-attached-copper-foil-attached sheet (B) was placed thereon, these procedures were repeated, 20 sets of these were placed between platens, at last one sheet of the aluminum foil-attached and single-side copper-foil-attached resin sheet (A) was placed (FIG. 2), and these sets were laminate-formed at 200° C. at 20 kgf/cm² under a vacuum of 30 mmHg or less for 2 hours, to obtain 20 sheets of double-side copper-clad multi-layered (four-layered) boards.

The aluminum foil on the lower surface of the protective sheet-attached copper-clad board after the laminate-formation was peeled off, the same backup sheet as that prepared in Example 1 was placed on the lower surface, the aluminum on the upper surface was also peeled off, the resultant upper surface was 3 shots irradiated by pulse oscillation with a carbon dioxide gas laser at an output of 15 mJ and 3 shots irradiated at an output of 20 mJ, to form 900 penetration holes having a diameter of 100 μm in a 50 mm×50 mm square area in each of 70 blocks. The backup sheet on the lower surface was separated. The board was placed in a plasma apparatus and treated. Then, a SUEP solution was insufflated at a high rate, to dissolve and remove copper foil burrs on the front and reverse surfaces and at the same time to dissolve the surface copper foils until the surface copper foils had a remaining thickness of 4 μm each. After a desmearing treatment was carried out, copper plating was carried out to form a plating layer having a thickness of 15 μm on each surface. Thereafter, circuits (line/space=50/50 μm), pads for solder balls, and the like were formed by a conventional method, portions other than at least a semiconductor chip portion, pad portions for bonding and solder ball pad portions were coated with a plating resist, and nickel plating and gold plating were carried out, to produce a printed wiring board. Table 4 shows the evaluation results to the printed wiring board.

Example 8

The same varnish as that prepared in Example 2 was used to impregnate a glass woven fabric having a thickness of 100 μm and dried to obtain prepreg having a gelation time of 150 seconds and a glass fabric content of 48% by weight.

Separately, a nickel treatment having a thickness of 3 μm was formed on a shiny surface of a double-side-treated copper foil having a width of 600 mm and a thickness of 9 μm. The above varnish was continuously applied to a mat surface of the copper foil opposite to the surface having the nickel treatment, and dried to form a B-staged resin layer having a thickness of 50 μm and a gelation time of 90 seconds, whereby a B-staged-resin-attached sheet was obtained. A 50 μm thick 4-methylpentene-1 film was continuously bonded to the nickel-treatment surface of the B-staged-resin-attached sheet with an adhesive in marginal portions having a size of 5 mm each, to obtain a film-attached double-side-treated copper foil B-staged resin sheet (q).

One sheet of the above prepreg having a size of 530 mm×530 mm was provided and general electrolytic copper foils having a thickness of 12 μm each were placed on upper and lower surfaces of the prepreg, and the resultant set was laminate-formed at 190° C. at 20 kgf/cm² under 30 mmHg, to obtain a double-side copper-clad laminate (e). Circuits were formed on both the surfaces of the double-side copper-clad laminate (e), and a treatment to form black copper oxide was carried out. Then, the above film-attached double-side-treated-electrolytic-copper-foil-attached B-staged resin sheets (q), which were cut so as to have a size of 540×540 mm each, were placed on the upper and lower surfaces, one sheet on one surface and one sheet on the other surface, while the films thereof were retained. Stainless steel plates having a thickness of 1.5 μm each were placed thereon, one plate on one surface and one plate on the other surface, 10 sets of these were placed between platens, and these sets were similarly laminate-formed under heat and pressure to form four-layered boards. Then, the protective film on the upper surface was retained as it was, and the protective film on the lower surface was peeled off. The same backup sheet as that prepared in Example 1 was disposed on the lower surface (FIG. 3(1)), and the copper foil surface was 2 shots irradiated with a carbon dioxide gas laser at an output of 15 mJ and 2 shots irradiated at an output of 20 mJ to make penetration holes having a diameter of 120 μm each.

Further, the resultant surface was 3 shots irradiated with a carbon dioxide gas laser at an output of 15 mJ to make blind via holes having a diameter of 100 μm (FIG. 3(2)). The protective film was removed, SUEP treatment was entirely carried out to dissolve and remove the copper foils on hole portions and at the same time to dissolve and remove the surface copper foils until the surface copper foils had a remaining thickness of 3 μm (FIG. 3(3)). Then, a desmearing treatment was carried out with a potassium permanganate aqueous solution, copper plating was carried out in the same manner as in Example 7 (FIG. 3(4)), and a printed wiring board was similarly obtained. Table 4 shows the evaluation results.

TABLE 4

| | Examples | |
|---|---|---|
| | 7 | 8 |
| Spaces between land copper foils on the front and reverse surfaces and a hole (μm) | 0 | 0 |
| Positional deviation between the hole and the internal layer (μm) | — | 0 |
| Pattern breakage and short circuits (pieces) | 0/200 | 0/200 |
| Glass transition temperature (° C.) | 235 | 160 |
| Through hole-heat cycle test (%) | | |
| 100 cycles | 1.2 | 1.4 |
| 300 cycles | 1.5 | 1.6 |
| 500 cycles | 1.7 | 1.9 |
| Processing time period for making penetration holes (minute) | 19 | 14 |
| Anti-migration properties (HAST) (Ω) | | |
| Ordinary state | $6 \times 10^{11}$ | — |
| 200 hours | $8 \times 10^{8}$ | |
| 500 hours | $7 \times 10^{8}$ | |
| 700 hours | $5 \times 10^{8}$ | |
| 1000 hours | $4 \times 10^{8}$ | |

Example 9

A varnish was prepared in the same manner as in Example 1 except that the amount of the aluminum hydroxide was changed from 1,000 parts to 0 part. The varnish was used to impregnate a 100 μm thick glass woven fabric and dried at 150° C. to prepare prepregs (c) having a gelation time of 102 seconds at 170° C. and a glass fabric content of 50% by weight.

A nickel alloy treatment (Y treatment, supplied by Japan energy) was formed on a 12 μm thick double-side-treated electrolytic copper foil (b) having a 530×530 mm square size. The copper foil (b) in marginal portions having a size of 10 mm each in side end portions which were opposed to each other was bonded to one surface of a 300 μm thick aluminum foil (a), to obtain a single-side carrier-attached copper foil, and the same copper foils (b) were similarly bonded to both the surfaces of a 300 μm thick aluminum foil (a), to obtain a double-side carrier-attached copper foil. The single-side carrier-attached copper foils were disposed on upper and lower surfaces as outermost layers such that each copper foil surface faced to two prepregs (c) disposed inside, one sheet of the double-side carrier-attached copper foil and two sheets of the prepregs (c) were alternately disposed inside (FIG. 4), 2 mm thick stainless steel plates were placed on the upper and lower surfaces of the above stacked materials, cushions were placed thereon, and these materials were placed between platens and laminate-formed at 200° C. at 20 kgf/cm² under a vacuum of 30 mmHg or less for 2 hours, to obtain double-side copper-clad laminates. In this case, there were placed materials sufficient for forming 20 sheets of the double-side copper-clad boards.

The same backup sheet as that prepared in Example 1 was placed on the lower surface of the double-side-treatedcopper-foil-attached copper-clad laminate, the upper surface was directly 6 shots irradiated with a carbon dioxide gas laser at an output of 15 mJ, to make 900 through holes having a diameter of 100 μm in a 50 mm×50 mm square area in each of 70 blocks (FIG. 5(2)). The backup sheet on the lower surface was separated, and a SUEP solution was insufflated at a high rate, to dissolve and remove copper foil burrs on the front and reverse surfaces and at the same time to dissolve the front-surface and reverse-surface copper foils until the copper foils had a remaining thickness of 4 μm each (FIG. 5(3)). After a desmearing treatment was carried out, copper plating was carried out to form a plating layer having a thickness of 15 μm on each surface (FIG. 5(4)). Thereafter, circuits (line/space=50/50 μm), pads for solder balls, and the like were formed by a conventional method, portions other than at least a semiconductor chip portion, pad portions for bonding and solder ball pad portions were coated with a plating resist, and nickel plating and gold plating were carried out, to produce a printed wiring board. Tables 5 and 6 show the evaluation results to the printed wiring board.

TABLE 5

|  | Examples 9 |
|---|---|
| Spaces between land copper foils on the front and reverse surfaces and a hole (μm) | 0 |
| Positional deviation between the hole and the internal layer (μm) | — |
| Pattern breakage and short circuits (pieces) | 0/200 |
| Glass transition temperature (° C.) | 235 |

TABLE 6

|  | Examples 9 |
|---|---|
| Through hole-heat cycle test (%) | |
| 100 cycles | 1.1 |
| 300 cycles | 1.2 |
| 500 cycles | 1.4 |
| Processing time period for making holes (minute) | 20 |
| Anti-migration properties (HAST) (Ω) | |
| Ordinary state | $2 \times 10^{11}$ |
| 200 hours | $8 \times 10^{8}$ |
| 500 hours | $8 \times 10^{8}$ |
| 700 hours | $7 \times 10^{8}$ |
| 1000 hours | $7 \times 10^{8}$ |

What is claimed is:

1. A method of making a hole in a copper-clad board, in which a surface of the metallic-treatment layer of the copper-clad board, which metallic-treatment layer contains nickel as an essential element, is directly irradiated with a carbon dioxide gas laser having an energy sufficient for processing a copper foil by means of the pulse oscillation of the carbon dioxide gas laser, and said carbon dioxide gas laser having substantially the same energy of irradiation from beginning to end, to make said hole, wherein said copper-clad board is obtained by disposing a double-side-treated copper foil provided with a metallic-treatment layer having a high absorption rate of a carbon dioxide gas laser energy on at least one surface, at least on an outer layer of a thermosetting resin composition layer such that the metallic-treatment layer is formed on a shiny surface of the copper foil which shiny surface is to be a surface layer, and laminate-forming the double-side-treated copper foil and the thermosetting resin composition layer under heat and pressure, to make an alloy of the metallic-treatment layer and the copper by the above heating.

2. A method according to claim 1, wherein the energy of the carbon dioxide gas laser is 5 to 60 mJ.

3. A method according to claim 1, wherein, after the hole is made with a carbon dioxide gas laser, copper foil burrs occurring around the hole are removed and at the same time parts of surface copper foils are two-dimensionally etched in the thickness direction.

4. A method according to claim 1, wherein the penetration hole and/or the blind via hole has a diameter of 80 to 180 μm.

5. A method of making a hole in a copper-clad board, in which a surface of the metallic-treatment layer of the copper-clad board, which metallic-treatment layer contains nickel as an essential element, is directly irradiated with a carbon dioxide gas laser having an energy sufficient for processing a copper foil by means of the pulse oscillation of the carbon dioxide gas laser, and said carbon dioxide gas laser having increasing energy of irradiation from beginning to end, to make said hole, wherein said copper-clad board is obtained by disposing a double-side-treated copper foil provided with a metallic-treatment layer having a high absorption rate of a carbon dioxide gas laser energy on at least one surface, at least on an outer layer of a thermosetting resin composition layer such that the metallic-treatment layer is formed on a shiny surface of the copper foil which shiny surface is to be a surface layer, and laminate-forming the double-side-treated copper foil and the thermosetting resin composition layer under heat and pressure, to make an alloy of the metallic-treatment layer and the copper by the above heating.

* * * * *